United States Patent [19]

Brasseur

[11] Patent Number: 5,298,466
[45] Date of Patent: Mar. 29, 1994

[54] METHOD AND APPARATUS FOR DRY ANISOTROPICALLY ETCHING A SUBSTRATE

[75] Inventor: Guy J. J. Brasseur, Tienen, Belgium

[73] Assignee: Cobrain N.V., Belgium

[21] Appl. No.: 348,664

[22] PCT Filed: Aug. 8, 1988

[86] PCT No.: PCT/EP88/00719
§ 371 Date: Apr. 6, 1989
§ 102(e) Date: Apr. 6, 1989

[87] PCT Pub. No.: WO89/01701
PCT Pub. Date: Feb. 23, 1989

[30] Foreign Application Priority Data

Aug. 7, 1987 [NL] Netherlands .......... 8701867

[51] Int. Cl.$^5$ .............. H01L 21/00; H01L 21/02; H01L 21/465; B44C 1/22
[52] U.S. Cl. ................. 437/228; 437/225; 156/643
[58] Field of Search .......... 437/225, 228, 229; 156/643, 646, 657, 659.1; 204/192.32, 192.37

[56] References Cited

U.S. PATENT DOCUMENTS

| | | |
|---|---|---|
| 4,253,907 | 3/1981 | Parry et al. |
| 4,407,850 | 10/1983 | Bruce et al. |
| 4,496,448 | 1/1985 | Tai et al. ............ 204/192.32 |
| 4,502,914 | 3/1985 | Trumpp et al. ............ 156/646 |
| 4,589,952 | 5/1986 | Behringer et al. ........... 156/657 |
| 4,615,764 | 10/1986 | Bobbio et al. |

FOREIGN PATENT DOCUMENTS 0140294 5/1985 European Pat. Off.
0195477 9/1986 European Pat. Off.

OTHER PUBLICATIONS

Wicker, T., Plasma etching in a multipolar discharge, J. Appl. Phys. 57(5), Mar. 1, 1985, pp. 1638–1647.
Eisele, K. M., Etching of SiO$_2$ in a narrowly confined plasma of highpower density, J. Vac. Sci. Tech. B 4(5), Sep./Oct. 1986, pp. 1227–1232.
Bruce, R., Anisotropy Control in Dry Etching, Solid State Tech., Oct. 1981, pp. 64–68.
Turban, G., Dry Etching of Polyimide in O$_2$–CF$_4$ and O$_2$–SF$_6$ Plasmas, J. Electrochem. Soc.: Solid-State Sci. and Tech., Nov. 1983, pp. 2231–2236.
Wolf, S., Silicon Processing for the VLSI Era, vol. 1, pp. 352–353, Lattice Press, 1986.

Primary Examiner—Brian E. Hearn
Assistant Examiner—B. Everhart
Attorney, Agent, or Firm—Ostrolenk, Faber, Gerb & Soffen

[57] ABSTRACT

The present invention provides a method for anisotropically dry etching a substrate, in which the substrate is brought into a processing area; a vacuum is applied over the processing area; and an audio frequency signal is applied at the electrodes of the processing area; such as to create a plasma at the processing area, having a power density substantially above 0.01 Watts/cm$^3$. Further, an apparatus for carrying out this method comprises a self-DC-bias on the cathode.

8 Claims, 1 Drawing Sheet

METHOD AND APPARATUS FOR DRY ANISOTROPICALLY ETCHING A SUBSTRATE

This invention relates to a method of plasma processing, more particularly to the dry processing of polymers and other materials and the dry development of photoresist for use, e.g. in the microelectronics industry.

Many different plasma systems are known: reactive ion etching; high pressure plasma etching; magnetron ion etching; microwave etching; and electron-cyclotron resonance.

The patterning of substrates necessarily involves selective etching of some material. This is typically done using a masking layer (such as photoresist) which has been previously patterned (e.g. using conventional photolithography and wet development) and which will be used to mask the substrate during the subsequent etch. Also, as more and more polymers are used in manufacturing, the need for fast and clean processing of those materials becomes important. In many cases, and this is specially true in the microelectronics industry, the dimensional control becomes more and more stringent due to the decreasing minimum linewidths. Also, the defect densities need to be reduced to increase the yield of the processes. To achieve this, it is often decided to replace the wet chemical processing steps by dry processes. In general, the etching of a material by use of plasma is carried out in a specially configured chamber at reduced pressure An etchant gas (or gaseous liquid) is introduced in the reaction vessel. The gas as such is mostly not reactive and will have no effect on the substrate to be etched. To make the gas reactive, it is ionized by powering electrodes located in the reaction vessel. The ionization is often done using microwaves (GHz) or radio-frequencies (RF)(MHz).

From U.S. Pat. No. 4,253,907 it is known to use etching at audio-frequencies; this known etching method is not practical because a power density of lower than 0.01 Watt/cm$^3$ is used.

The present invention has for its object to provide a method for dry processing or etching, that is fast and shows a high degree of anisotropy; an apparatus designed for this method can be kept simple.

Therefor the present invention provides a method for dry processing or etching a substrate, in which: the substrate is brought into a processing area; a vacuum is applied over the processing area; a audio frequency signal is applied at electrodes of the processing area, such as to create a plasma at the processing area, having a power density substantially above 0.01 Watt/cm$^3$.

Further an apparatus for carrying out this method comprises a self-DC-bias on the electrode.

The matching network of the power system of the apparatus according to the prevent invention is designed such as to obtain a self-DC-bias on the cathode. The matching unit together with the plasma, will provide an equivalent load which matches the generators output impedance, resulting in an optimal power transfer to the plasma. The self-DC-bias will sustain the plasma at those low frequencies so that a stable working regime can be obtained. In a specific embodiment, the volume power densities can be much higher (typically ranging from 0.03 to 1 Watt/cm$^3$), resulting in a highly ionized plasma. The combination of the audio-frequencies and the self-DC-bias of the plasma results in a high density plasma, well suited for advanced processes of different types of materials such as polymers, oxides, nitrides, polycrystalline materials, etc. Indeed, as the ions can follow the audio frequency alternating electrical field (with radio-frequency plasmas (13.56 MHz), the ions cannot follow the alternating field due to their low mobility), they will be forced to strike the substrate perpendicularly, having an energy which is approximately proportional to the DC-self-bias (if no collisions occur in the dark sheath). This means that the ions will also have a sputtering effect, enhancing the anisotropy by promoting the directional sputter assisted etch component. In a practical system, the DC-self-bias voltages range from several volts to several hundreds of volts while the ionization—being defined as the number of ionized particles per cm$^3$—ranges from $5.10^{11}$ to $10^{12}$ at a pressure of e.g. 100 mTorr. The ionization degree—defined as the ratio of the number of ionized particles to the total number of particles at that specific pressure—can thus be as high as $10^{-3}$. These figures are typically a decade higher than for other existing plasma processes.

Experiments carried out on a prototype using the above mentioned combination of audio frequency and matching network have shown that this plasma can be favorably applied to the etching of polymeric materials, including organo-metallics, with high etch rate. A clean, very fast and aniso-tropic etch can be performed showing a high power efficiency, resulting in a good definition of the patterned structures. A specific application of this process is its use for dry development of resists and the patterning of multilayer-structures in the micron and sub-micron region.

Preliminary experiments have shown that plasmas created with the above method can be successfully used for treatments of large areas, such as printed circuit boards, displays and plates of glass (up to several square meters). The impedance of the audio frequency plasma (strongly resistive as opposed to capacitive for high frequency etching) and the flexibility of our proposed matching network makes this possible and easy to implement.

BRIEF DESCRIPTION OF THE DRAWING

Further details, advantages and features of the present invention will be clearified in the following description, in which references are made to the drawing, in which show.

As mentioned above, due to the further decrease of the minimal dimensions, the wet processing of photoresist can be replaced by dry processing for accurate linewidth control and reproducibility. This of course is also true for other materials. To obtain a high enough etch rate, and thus a high enough throughput, a highly ionized plasma should be used so as to have as much reactive species as possible contributing to the etching process. A possible way to achieve this is to use audio frequencies to generate the plasma which will attack the substrate thereby forming volatile products which will be pumped away by the vacuum system. The pressure in such a system typically ranges from 1 mTorr up to several mTorr. In our application the optimal pressure range seems to start at 20 mTorr and goes up to 500 mTorr. The pressure will impact on the anisotropy of the process.

From the prior art it is clear that high etch rates using state of the art etching processes requires high power densities—even if magnetic confinement is used—, possibly resulting in damage to the structures to be etched. The use of audio frequencies enables one to achieve high etch rates and good anisotropy with low power densities and medium pressures.

Figure 1:
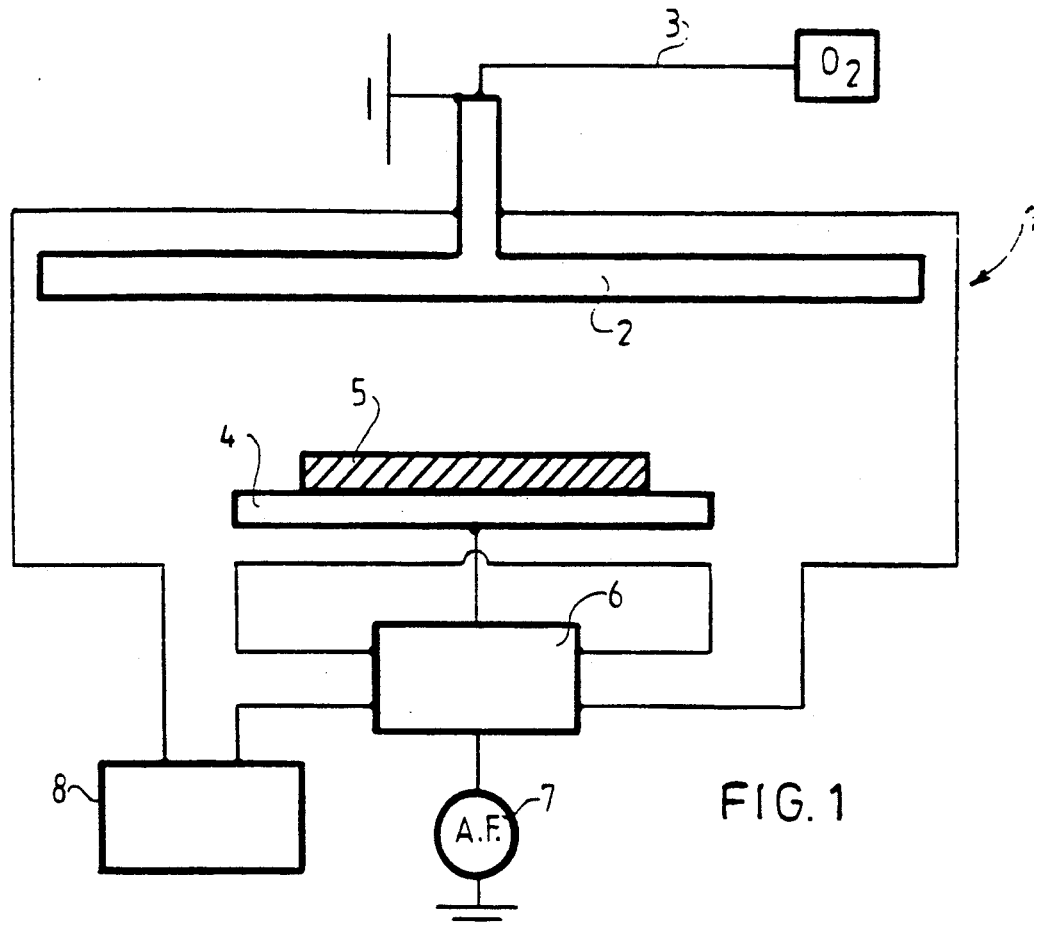
FIG. 1 a diagramatic view of an apparatus for carrying out a method according to the present invention and FIG. 2 a more detailed view of the matching of the apparatus of FIG. 1.
Figure 2:
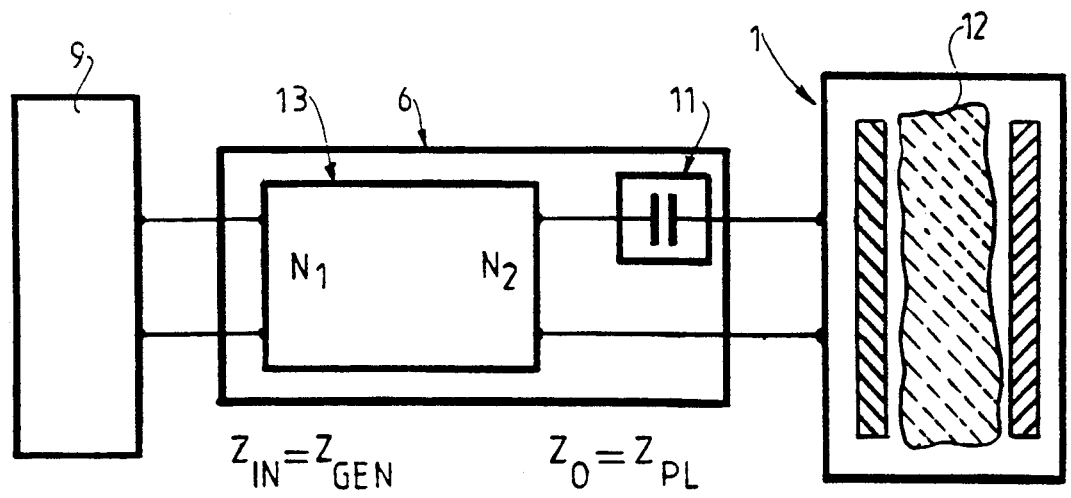

An embodiment of an apparatus 1 for carrying out the method according to the present invention (FIG. 1) comprises a top electrode 2, in the present example used as a connection to the gas-inlet 3 (shower-head) for supplying gas—in this embodiment oxygen ($O_2$)—into the apparatus or reaction vessel 1 through a not shown mass flow meter. A substrate 5 is placed on a bottom electrode 4 (the cathode) which can be heated or cooled depending on the process. An audio frequency alternating signal from a source 7 (FIG. 1) or generator 9 (FIG. 2) is applied on the cathode through a matching network 6 (FIGS. 1,2) containing a transformer 13 and a capacitor 11.

Typically the plasma 12 (FIG. 2) between the electrodes in the apparatus 1, is fed with a voltage of e.g. 1200–1400 Volt (peak–peak-value). The matching at audio frequencies is very simple; a simple transformer substantially matches the impedances between generator and plasma. The capacitor has a typical value of 1 $\mu$F and provides the DC-bias at the cathode (e.g. 1000–2000 Volt), because of differences in mobility in ions and electrons in the plasma. The gas is ionized and a negative bias voltage develops on the cathode as a result of the charging of the capacitor. The DC-bias attracts positive ions out of the bulk of the plasma accelerating them to the substrate. Those reactive species strike the plasma perpendicularly and with enough energy to promote the directional sputter assisted etching component.

In the prototype, dry development of photoresist see EP-A-85.870.142.8) has extensively been studied. Etch rates higher than 1 $\mu$m/min are obtained for power densities of 0.3 to 1 Watt/cm$^2$ and pressures ranging from 50 to 300 mTorr. A limited amount of physical sputtering—as introduced by the present invention—is beneficial in removing residues upon development.

In the case of etching other polymers such as polyimides, PVDF, kapton etc., the same increase in etch rate compared to state of the art technologies is seen.

Also, in the case of etching silicon oxide, etch rate of 7000 A/min have been observed for power densities of 0.5 Watt/cm$^2$.

Although detailed etching experiments on other materials have not yet been done, it is expected that these other materials will also exhibit increased etchrates and good anisotropy.

As a conclusion, it is clear that the use of the audio-frequencies combined with the matching network consisting of a transformer and a blocking capacitor result in a high rate etch with good anisotropy without having to build a more complex system such as Magnetron confinement or Electron-Cyclotron systems.

I claim:

1. A method for anisotropically dry processing or etching a substrate, comprising the steps of arranging the substrate in the vicinity of one of two electrodes, the electrodes being an anode and a cathode, introducing an etchant gas between the two electrodes and bringing the etchant gas into a plasma state as a result of an applied voltage between the two electrodes, wherein the plasma is created by using a generator for applying an audio frequency alternating voltage between the anode and the cathode, and wherein a matching network is used, the matching network including a transformer connected to the generator for matching the impedances of the generator and the plasma for the audio frequencies, and including a capacitor connected between the transformer and the cathode, the capacitor having a capacitance value such that a dc self bias is provided at the cathode for the audio frequencies, wherein the plasma has a power density substantially greater than 0.01 W/cm$^3$, and wherein the capacitance value is about 1 $\mu$F and the self bias has a value of 1000–2000 V.

2. The method according to claim 1, further comprising the step of adjusting the power density to between 0.3–1 W/cm$^3$.

3. The method according to claim 1, further comprising the step of providing a vacuum in the reaction chamber.

4. The method according to claim 3, further comprising the step of adjusting the vacuum in the reaction chamber to 50–300 mTorr.

5. The method of claim 1, further comprising the step of influencing the anisotropy of the dry processing or etching by modulating the alternating voltage.

6. The method according to claim 1, further comprising the step of providing a substrate formed of a polymeric material.

7. The method according to of claim 1, further comprising the step of providing a substrate formed of a polyimide, an organo-metallic, polyvinylidene fluoride, polytetrafluoroethylene or an epoxy.

8. An apparatus for anisotropically dry processing or etching a substrate, comprising:
a reaction chamber including a cathode and an anode;
means for obtaining a vacuum within the reaction chamber; and
means for creating a plasma having a power density substantially greater than 0.01 W/cm$^3$ between the cathode and the anode, the plasma creating means including a generator for applying an audio frequency alternating voltage between the cathode and the anode, a transformer for matching the impedances of the generator and the plasma at the audio frequencies, and a capacitor having a capacitance value of about 1 $\mu$F for providing a dc self bias at the cathode of 1000–2000 V.

* * * * *